United States Patent
Lee et al.

(10) Patent No.: US 9,837,316 B2
(45) Date of Patent: Dec. 5, 2017

(54) METHOD OF MANUFACTURING THIN FILM TRANSISTOR, AND METHOD OF MANUFACTURING DISPLAY APPARATUS

(71) Applicant: SAMSUNG DISPLAY CO., LTD., Yongin-si, Gyeonggi-do (KR)

(72) Inventors: Jongchan Lee, Yongin-si (KR); Yoonho Khang, Yongin-si (KR); Myounghwa Kim, Yongin-si (KR); Joonhwa Bae, Yongin-si (KR); Myounggeun Cha, Yongin-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 15/367,568

(22) Filed: Dec. 2, 2016

(65) Prior Publication Data

US 2017/0084755 A1 Mar. 23, 2017

Related U.S. Application Data

(62) Division of application No. 14/597,563, filed on Jan. 15, 2015, now Pat. No. 9,515,154.

(30) Foreign Application Priority Data

Aug. 6, 2014 (KR) ........................ 10-2014-0101099

(51) Int. Cl.
*H01L 21/77* (2017.01)
*H01L 21/8234* (2006.01)
(Continued)

(52) U.S. Cl.
CPC ............ *H01L 21/823418* (2013.01); *H01L 21/02422* (2013.01); *H01L 21/02488* (2013.01); *H01L 21/02532* (2013.01); *H01L 21/02592* (2013.01); *H01L 21/02667* (2013.01); *H01L 21/02672* (2013.01); *H01L 21/28518* (2013.01); *H01L 21/32053* (2013.01); *H01L 27/1222* (2013.01); *H01L 27/1274* (2013.01); *H01L 27/1277* (2013.01); *H01L 29/41733* (2013.01);
(Continued)

(58) Field of Classification Search
CPC ............ H01L 27/1274; H01L 27/1277; H01L 21/02667; H01L 21/02672; H01L 21/28518; H01L 21/823418
See application file for complete search history.

(56) References Cited

U.S. PATENT DOCUMENTS

| 7,423,322 B2 | 9/2008 | Seo et al. |
| 8,283,668 B2 | 10/2012 | Park |

(Continued)

FOREIGN PATENT DOCUMENTS

| KR | 2002-0057382 | 7/2002 |
| KR | 10-2005-0078392 A | 8/2005 |

(Continued)

*Primary Examiner* — Fei Fei Yeung Lopez
(74) *Attorney, Agent, or Firm* — Lee & Morse, P.C.

(57) ABSTRACT

A thin film transistor includes a polysilicon layer on a substrate, which includes a first area between second and third areas. A polysilicon layer is formed on the substrate, and a source electrode and a drain electrode are formed on the polysilicon layer in the first and third areas. Each of the source electrode and the drain electrode includes a metal silicide layer adjacent the polysilicon layer.

11 Claims, 8 Drawing Sheets

(51) Int. Cl.
- *H01L 21/285* (2006.01)
- *H01L 29/786* (2006.01)
- *H01L 29/45* (2006.01)
- *H01L 29/417* (2006.01)
- *H01L 29/66* (2006.01)
- *H01L 21/02* (2006.01)
- *H01L 27/12* (2006.01)
- *H01L 21/3205* (2006.01)
- *H01L 27/32* (2006.01)

(52) U.S. Cl.
CPC ...... *H01L 29/458* (2013.01); *H01L 29/66765* (2013.01); *H01L 29/78618* (2013.01); *H01L 29/78678* (2013.01); *H01L 27/3262* (2013.01)

(56) References Cited

U.S. PATENT DOCUMENTS

| | | |
|---|---|---|
| 2002/0137310 A1 | 9/2002 | Joo et al. |
| 2005/0250267 A1 | 11/2005 | Paik |
| 2006/0033106 A1 | 2/2006 | Seo et al. |
| 2006/0040429 A1* | 2/2006 | Park ............... H01L 21/2026 438/141 |
| 2008/0296565 A1 | 12/2008 | Park et al. |
| 2010/0194719 A1 | 8/2010 | Saitoh et al. |
| 2010/0320467 A1 | 12/2010 | Ukeda et al. |

FOREIGN PATENT DOCUMENTS

| | | |
|---|---|---|
| KR | 10-2005-0106256 A | 11/2005 |
| KR | 10-2006-0015183 A | 2/2006 |
| KR | 10-2008-0105563 A | 12/2008 |

* cited by examiner

METHOD OF MANUFACTURING THIN FILM TRANSISTOR, AND METHOD OF MANUFACTURING DISPLAY APPARATUS

CROSS-REFERENCE TO RELATED APPLICATIONS

This is a divisional application based on pending application Ser. No. 14/597,563, filed Jan. 15, 2015, the entire contents of which is hereby incorporated by reference.

Korean Patent Application No. 10-2014-0101099, filed on Aug. 6, 2014, and entitled, "Thin Film Transistor, Display Apparatus Comprising the Same, Method of Manufacturing Thin Film Transistor, and Method of Manufacturing Display Apparatus," is incorporated by reference herein in its entirety.

BACKGROUND

1. Field

One or more embodiments of the present invention relate to a thin film transistor, a display apparatus including a thin film transistor, a method of manufacturing a thin film transistor, and a method of manufacturing a display apparatus.

2. Description of the Related Art

A thin film transistor (TFT) includes a gate electrode, a source electrode, a drain electrode, and a semiconductor layer, e.g., a polysilicon layer. Some methods for making TFTs use expensive equipment which increases costs. Examples of this equipment include doping apparatuses for forming lightly doped drain (LDD) areas on the polysilicon layer. The LDD areas are formed, for example, to reduce contact resistance between source and drain regions and the polysilicon layer.

SUMMARY

In accordance with one embodiment, a thin film transistor includes a substrate including a first area, a second area adjacent to one side of the first area, and a third area adjacent to another side of the first area, a polysilicon layer on the substrate, and a source electrode and a drain electrode on the polysilicon layer in the first and third areas, each of the source electrode and the drain electrode including a metal silicide layer adjacent the polysilicon layer.

Each of the source and drain electrodes may include an additional metal layer that contacts an upper surface of the metal silicide layer. The metal silicide layer may include a silicide of a material included in the additional metal layer. The additional metal layer may include a first layer on the metal silicide layer and a second layer on the first layer. The metal silicide layer may include metal catalysts to induce crystallization of the polysilicon layer. The metal silicide layer may include a silicide of a material to getter the metal catalysts. The metal silicide layer may include a titanium silicide.

In accordance with another embodiment, a display apparatus includes a thin film transistor in accordance with the aforementioned embodiment, and a display that is electrically connected to at least one of source or drain electrodes of the transistor.

In accordance with another embodiment, a method of manufacturing a thin film transistor includes forming an amorphous silicon layer on a substrate including a first area, a second area adjacent to one side of the first area, and a third area adjacent to another side of the first area, disposing metal catalysts on an upper surface of the amorphous silicon layer, forming a metal layer over the amorphous silicon layer and the metal catalysts in the second and third areas, and transforming the amorphous silicon layer into a polysilicon layer and conditioning the metal layer to include a metal silicide layer using a heat treatment process.

Forming the metal layer may include forming the metal layer to cover the amorphous silicon layer and the metal catalysts in the first through third areas, and removing a portion of the metal layer in at least a portion of the first area. Removing the portion of the metal layer may include removing at least a portion of the metal catalysts between the metal layer and amorphous silicon layer in the first area. Conditioning the metal layer may include transforming all portions of the metal layer into the metal silicide layer.

The method may include forming an additional metal layer to contact the metal silicide layer. Forming the additional metal layer may include using a material identical to a material used in forming the metal layer. Forming the additional metal layer may include forming a first layer including a material identical to a material used in forming the metal layer, and a second layer on the first layer, the second layer including a different material from the first layer.

Conditioning the metal layer may include transforming a portion of the metal layer facing the amorphous silicon layer into the metal silicide layer, wherein a remaining portion of the metal layer remains as an additional metal layer. Forming the metal layer may include forming a first layer over the amorphous silicon layer and the metal catalysts in the second and third areas, and a second layer on the first layer, wherein the second layer includes a material different from a material used to form the first layer.

Conditioning the metal layer may include transforming a portion of the first layer facing the amorphous silicon layer into the metal silicide, wherein a remaining portion of the first layer and the second layer remains as an additional metal layer.

In accordance with another embodiment, a method of manufacturing a display apparatus includes forming a thin film transistor using any of the aforementioned embodiments, and forming a display that is electrically connected to the transistor.

In accordance with another embodiment, a thin film transistor includes a substrate, an intermediate layer over the substrate, and a gate electrode on the substrate, and a source electrode and a drain electrode over the intermediate layer, each of the source electrode and the drain electrode including a metal silicide layer adjacent the intermediate layer. The intermediate layer may include polysilicon.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
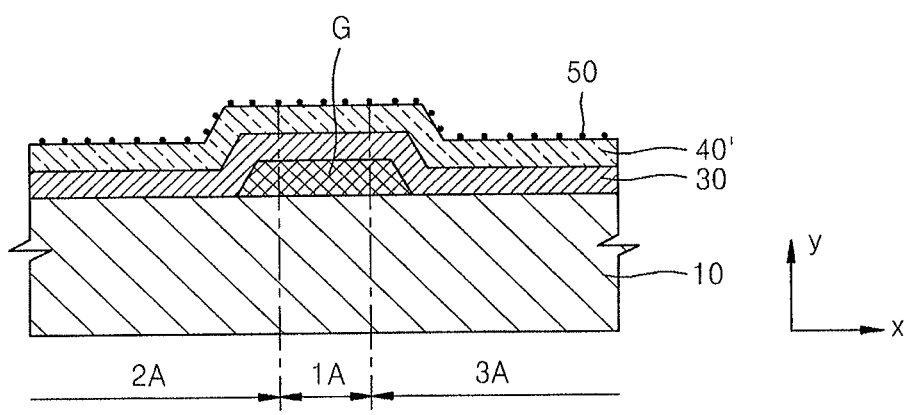
FIGS. 1 to 5 illustrate an embodiment of a method for manufacturing a TFT.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

FIGS. 1 to 5 illustrate an embodiment of a method for manufacturing a TFT. The method includes preparing a substrate 10 which may include, for example, glass, metal, or plastic such as polyethylene terephthalate (PET), polyethylene naphthalate (PEN), or polyimide.

The substrate 10 includes a first area 1A between a second area 2A and a third area. The second area 2A is adjacent one side of the first area 1A in a first direction, e.g., an −x direction. The third area 3A is adjacent another side of the first area 1A in a second direction, e.g., +x direction. The first area 1A may correspond to a gate electrode G of the TFT. In one embodiment, the first area 1A corresponds to a channel area. The second and third areas 2A and 3A may correspond to source and drain areas.

After preparing the substrate 10, an amorphous silicon layer 40' may be formed on the substrate 10. Before forming the amorphous silicon layer 40', a buffer layer may be formed on the substrate 10 by using materials such as but not limited to a silicon oxide or a silicon nitride. The buffer layer may prevent impurities from penetrating into the amorphous silicon layer 40' or a polysilicon layer formed by crystallizing the amorphous silicon layer 40'. The buffer layer may be formed using organic insulating materials such as polyethylene terephthalate (PET), polyethylene naphthalate (PEN), polyacrylate, or polyimide, for example.

Before forming the amorphous silicon layer 40', as illustrated in FIG. 1, the gate electrode G may be formed to correspond to the first area 1A using a conductive material. A gate insulating layer 30 may be formed to cover the gate electrode G using an insulating material such as but not limited to silicon oxide, silicon nitride and/or other insulating organic or inorganic materials.

In one embodiment, the gate electrode G corresponding to the first area 1A may be formed to be disposed only in the first area 1A. In another embodiment, as illustrated in FIG. 1, the gate electrode G may overlap other areas. For example, the gate electrode may overlap one or more of areas 2A or 3A, and may be aligned so that a predetermined point (e.g., center) of the gate electrode G approximately corresponds to the center of the first area 1A. For example, a portion of the gate electrode G may be outside the first area 1A as in FIG. 1. In another embodiment, the gate electrode G may not completely fill the first area 1A.

After forming the amorphous silicon layer 40', metal catalysts 50 may be disposed on an upper surface of the amorphous silicon layer 40' as illustrated in FIG. 1. The metal catalysts 50 may be disposed on the amorphous silicon layer 40' using, for example, a sputtering method. FIG. 1 illustrates that the metal catalysts 50 are spaced apart. In another embodiment, a thin layer formed of the metal catalysts 50 may be provided on the amorphous silicon layer 40'. The metal catalysts 50 may include, for example, nickel (Ni), palladium (Pd), titanium (Ti), silver (Ag), gold (Au), aluminum (Al), tin (Sn), antimony (Sb), copper (Cu), cobalt (Co), molybdenum (Mo), terbium (Tr), ruthenium (Ru), rhodium (Rh), cadmium (Cd), and/or platinum (Pt).

Figure 2:
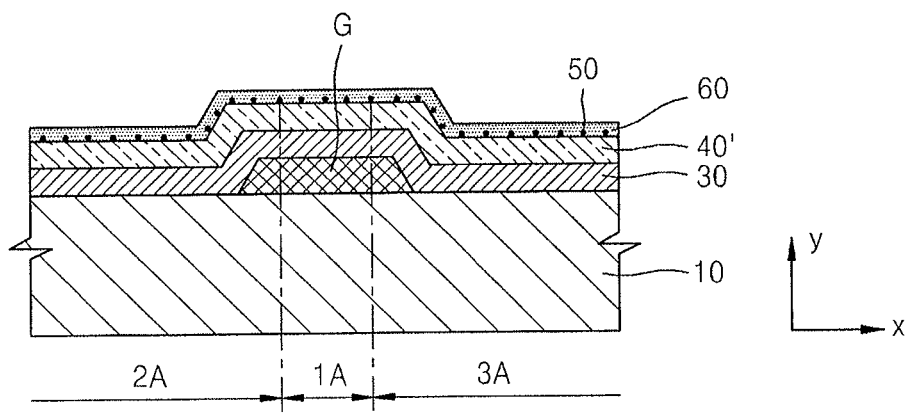
Figure 3:
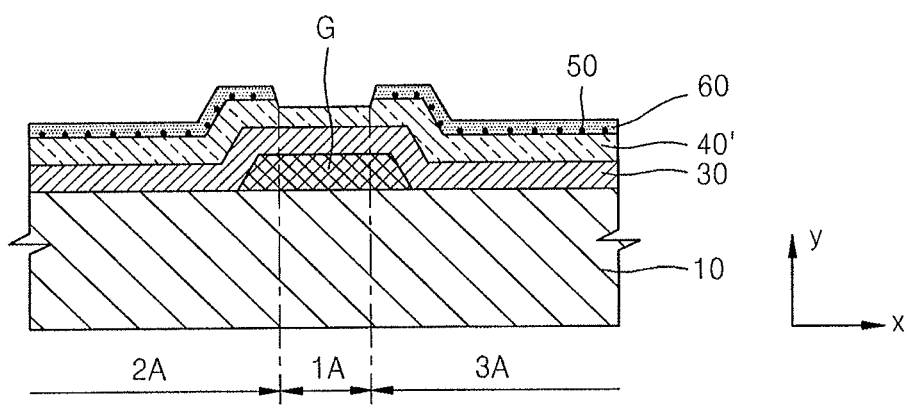

Next, a metal layer 60 is formed in the second and third areas 2A and 3A to cover the amorphous silicon layer 40' and the metal catalysts 50. The metal layer 60 may be formed in various ways. For example, the metal layer 60 may be formed to completely cover the upper surface of the amorphous silicon layer 40' as illustrated in FIG. 2. Then, a portion of the metal layer 60 may be removed from at least a portion of the first area 1A as illustrated in FIG. 3. The metal layer 60 may be formed of a material that may getter the metal catalysts 50, for example, Ti.

When removing a portion of the metal layer 60, at least a portion of the metal catalysts 50 between the metal layer 60 and the amorphous silicon layer 40' in the first area 1A may also be removed. During this process, as illustrated in FIG. 3, a portion of the upper surface of the amorphous silicon layer 40' in the first area 1A may be removed together. Thus, a thickness of the amorphous silicon layer 40' in at least a portion of the first area 1A may be less than a thickness of the amorphous silicon layer 40' in the second area 2A or the third area 3A. Even if this process is performed, the metal catalysts 50 may not be completely removed in the first area 1A. However, a concentration of the metal catalysts 50 in the first area 1A may be relatively lower than a concentration of the metal catalysts 50 in the second area 2A or the third area 3A.

Figure 4:
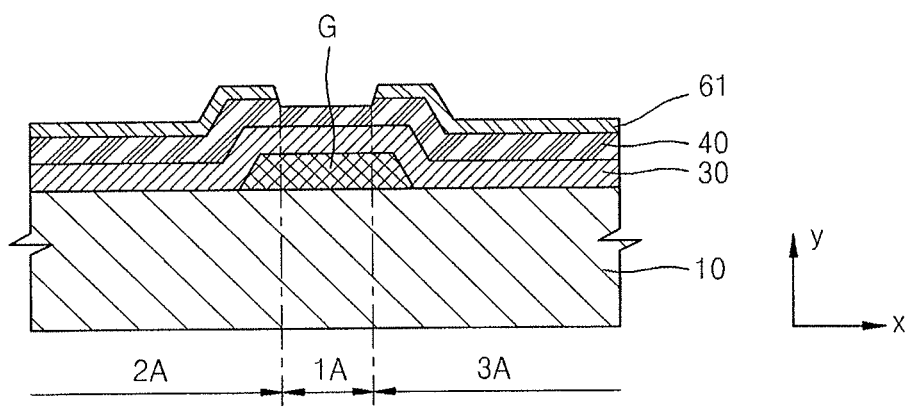

Subsequently, a heat treatment process is performed to transform the amorphous silicon layer 40' into a polysilicon layer 40 using the metal catalysts 50, as illustrated in FIG. 4. In this case, the metal catalysts 50 may not exist in the first area 1A. Even if the metal catalysts 50 exist in the first area 1A, the concentration of the metal catalysts 50 in the first area 1A is much less than the concentration of the metal catalysts 50 in the second area 2A or the third area 3A. Thus, sizes of grains may be significantly increased during a crystallization process. As a result, electrical properties (e.g., mobility) of the polysilicon layer 40 may be improved.

When transforming the amorphous silicon layer 40' into the polysilicon layer 40 by the heat treatment process, the metal layer 60 may be transformed into a metal silicide layer 61. When the metal layer 60 includes Ti, the metal silicide layer 61 includes a titanium silicide. In this case, because the metal layer 60 may be formed of a material that may getter the metal catalysts 50, the metal catalysts 50 that exist in the metal layer 60 and the amorphous silicon layer 40' are gettered into the metal layer 60.

By significantly reducing the concentration of the metal catalysts 50 in the polysilicon layer 40 that is crystallized as described above, electrical properties (e.g., mobility, a threshold voltage, etc.) of the TFT may be improved when the TFT is completely manufactured. Also, because a process of removing the metal catalysts 50 does not need to be additionally performed after forming the polysilicon layer 40 by crystallizing the amorphous silicon layer 40', the manufacturing process may be significantly simplified.

By way of comparison, in another type of method for manufacturing a TFT, a polysilicon layer is formed by crystallizing an amorphous silicon layer using metal catalysts when the metal layer 60 does not exist. When the polysilicon layer contacts a source/drain electrode in this state, contact resistance between the source/drain electrode and the polysilicon layer is very high. In an attempt to reduce the contact resistance, a process may be performed (such as forming a lightly doped drain (LDD) area) using an expensive doping apparatus. Use of such an apparatus increases costs.

In contrast, the method of manufacturing a TFT according to the present embodiment includes naturally forming the metal silicide layer 61 at a location that corresponds to the second and third areas 2A and 3A while crystallizing the amorphous silicon layer 40'. Because the metal silicide layer 61 is between the source/drain electrode and the polysilicon layer 40, contact resistance between the source/drain electrode and the polysilicon layer 40 may be significantly reduced. Therefore, an improved TFT may be manufactured without using an expensive doping apparatus.

Figure 5:
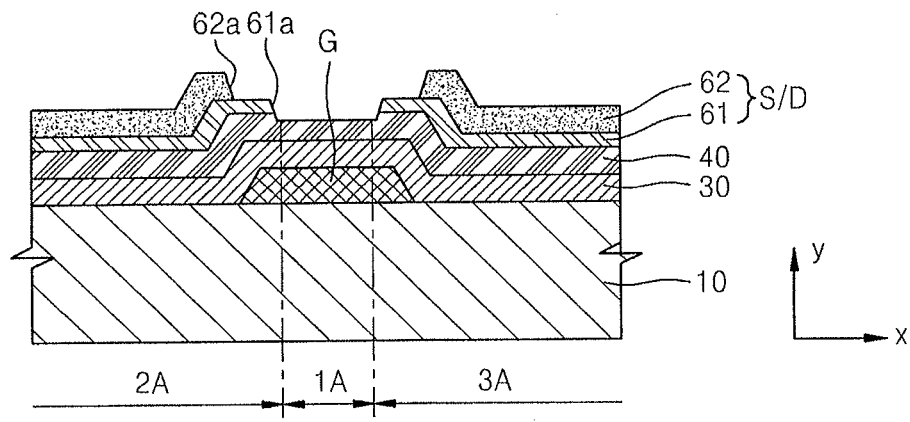

As illustrated in FIG. 4, in one embodiment, all portions of the metal layer 60 may be transformed into the metal silicide layer 61. In this case, as illustrated in FIG. 5, a process of forming an additional metal layer 62 that contacts the metal silicide layer 61 may be performed. A stack formed of the metal silicide layer 61 and the additional metal layer 62 may be regarded as a source/drain electrode S/D. An end surface 62a of the additional metal layer 62 facing the center of the first area 1A may not correspond to an end surface 61a of the metal silicide layer 61 facing the center of the first area 1A. This is because the metal layer 60, which is used to form metal silicide layer 61, is patterned during a process other than a process of patterning the additional metal layer 62.

The additional metal layer 62 may be formed of various materials, e.g., a material that is the same as a material used when forming the metal layer 60. For example, when the metal layer 60 is formed of Ti to produce a metal silicide layer 61 that includes a titanium silicide, the additional metal layer 62 may be formed of Ti. In this case, because the additional metal layer 62 and the metal silicide layer 61 include the same or similar elements, adhesion strength between the additional metal layer 62 and the metal silicide layer 61 may be excellent and contact resistance therebetween may be significantly reduced.

Figure 6:
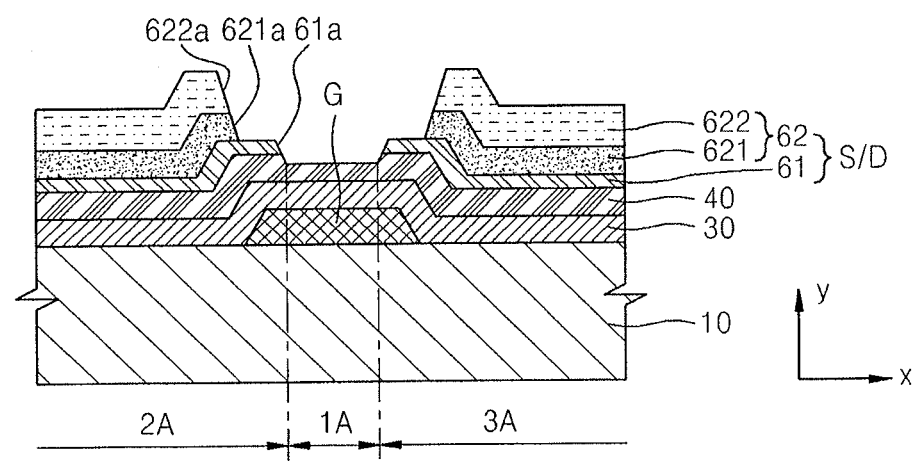
FIG. 6 illustrates another embodiment of a method for manufacturing a TFT.

Alternatively, as illustrated in FIG. 6, the additional metal layer 62 may be formed by forming a first layer 621 and a second layer 622 that is disposed above the first layer 621. The first layer 621 may include a material that is the same as a material used when forming the metal layer 60. The second layer 622 may be formed of a different material. For example, if the metal layer 60 is formed of Ti (and thus the metal silicide layer 61 includes a titanium silicide), the first layer 621 may be formed of Ti and the second layer 622 may be formed of Cu.

In this case, because the first layer 621 of the additional metal layer 62 and the metal silicide layer 61 include the same or similar elements, adhesion strength between the first layer 621 and the metal silicide layer 61 may be excellent and contact resistance therebetween may be significantly reduced.

Also, because the second layer 622 includes Cu, which has excellent electrical properties such as conductivity, the electrical properties (e.g., conductivity) of the source/drain electrode S/D may be improved. In one embodiment, a stack formed of the additional metal layer 62 that includes the first and second layers 621 and 622 and the metal silicide layer 61 may be regarded as the source/drain electrode S/D.

The first and second layers 621 and 622 of the additional metal layer 62 may be simultaneously patterned, so that an end surface 621a of the first layer 621 facing the center of the first area 1A may correspond to an end surface 622a of the second layer 622 facing the center of the first area 1A. However, the end surface 621a of the first layer 621 facing the center of the first area 1A and the end surface 622a of the second layer 622 facing the center of the first area 1A may not correspond to the end surface 61a of the metal silicide layer 61 facing the center of the first area 1A metal silicide layer 61. This is because the metal layer 60, which is used to form the metal silicide layer 61, is patterned during a process other than a process of patterning the first layer 621 or the second layer 622.

Figure 7:
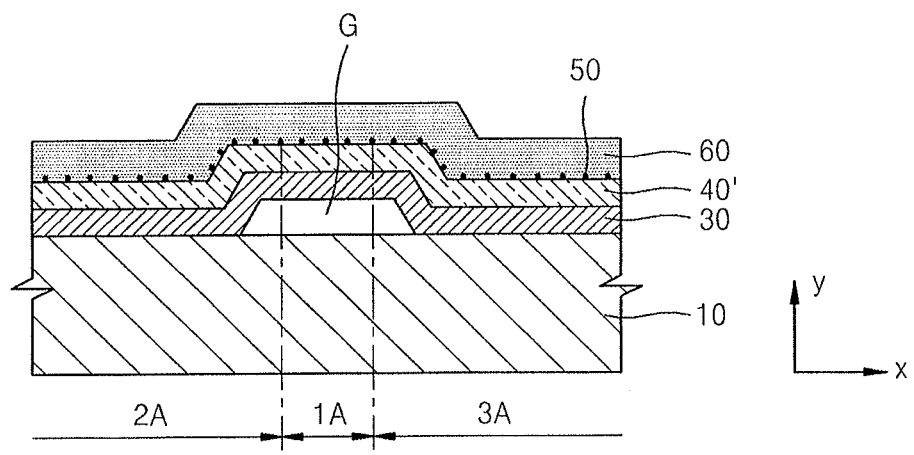
FIGS. 7 to 9 illustrate another embodiment of a method fir manufacturing a TFT.
Figure 8:
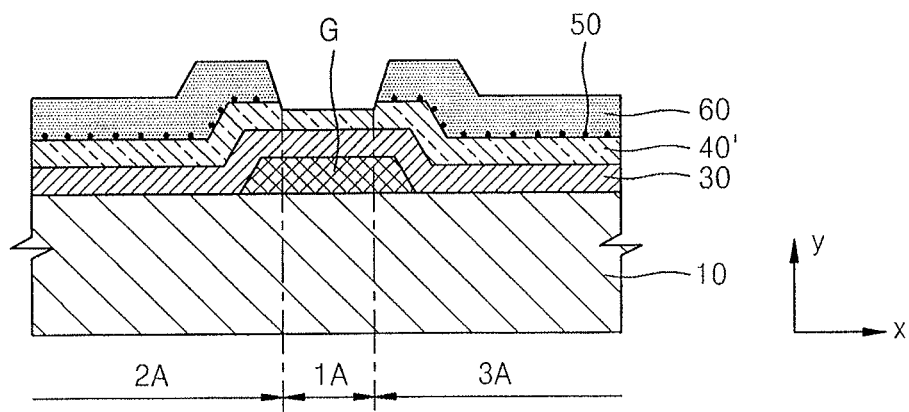
Figure 9:
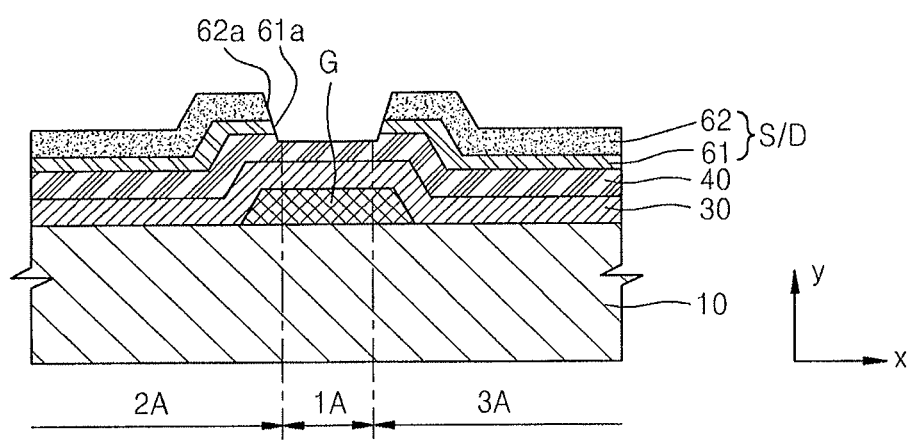

FIGS. 7 to 9 illustrate another embodiment of a method for manufacturing a TFT. Based on the method illustrated in FIG. 7, when forming the metal layer 60 using Ti or other materials, the metal layer 60 may be thicker than that shown in FIG. 2. In this case, a portion of the metal layer 60 may be removed from at least a portion of the first area 1A as illustrated in FIG. 8. Then, a heat treatment process may be performed. As a result, the amorphous silicon layer 40' may be transformed into the polysilicon layer 40 using the metal catalysts 50, as illustrated in FIG. 9.

Because the metal layer 60 is thick, all portions of the metal layer 60 may not be transformed into a metal silicide layer. Rather, only a portion of the metal layer 60 facing the amorphous silicon layer 40' may be transformed into the metal silicide layer 61. In this case, a remaining portion of the metal layer 60 may be regarded as the additional metal layer 62. The stack formed of the metal silicide layer 61 and the additional metal layer 62 may be regarded as the source/drain electrode S/D. The end surface 62a of the additional metal layer 62 facing the center of the first area 1A may correspond to the end surface 61a of the metal silicide layer 61 facing the center of the first area 1A. This is because a portion of the metal layer 60 has been transformed into the metal silicide layer 61 after the metal layer 60 is patterned.

Under some circumstances, the interface between the metal silicide layer 61 and the additional metal layer 62 may not be as clear as illustrated in FIG. 9. For example, in the source/drain electrode S/D, a concentration of the metal silicide may decrease from a portion near the substrate 10 to a portion away from the substrate 10 (in a +y direction). In accordance with the method of the present embodiment, the source/drain electrode S/D that includes the metal silicide layer 61 and the additional metal layer 62 may be formed without performing a process of additionally forming additional metal layer 62.

Figure 10:
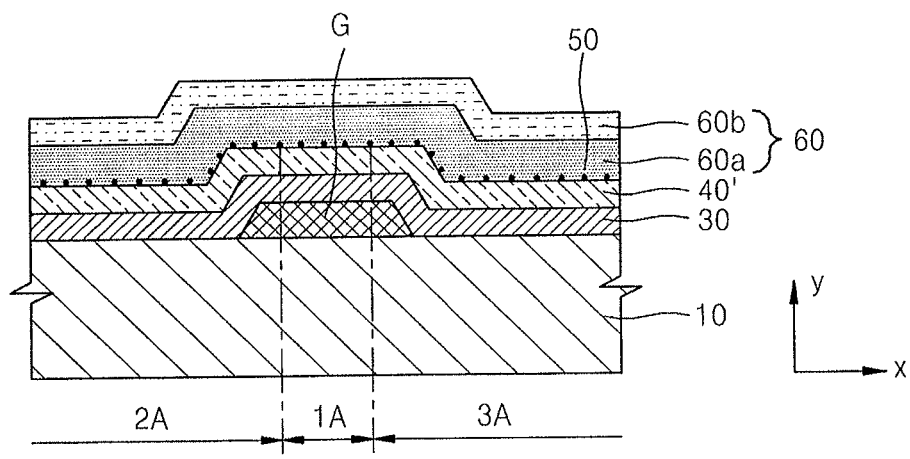
FIGS. 10 to 12 illustrate another embodiment of a method for manufacturing a TFT.
Figure 11:
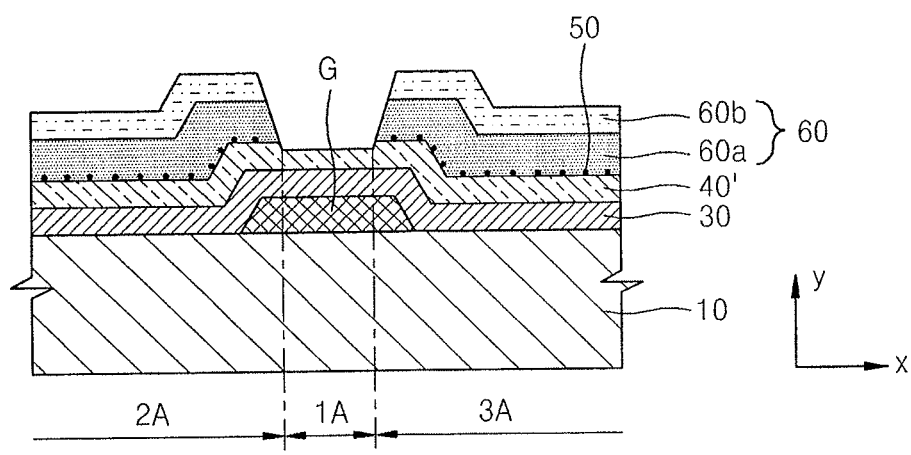
Figure 12:
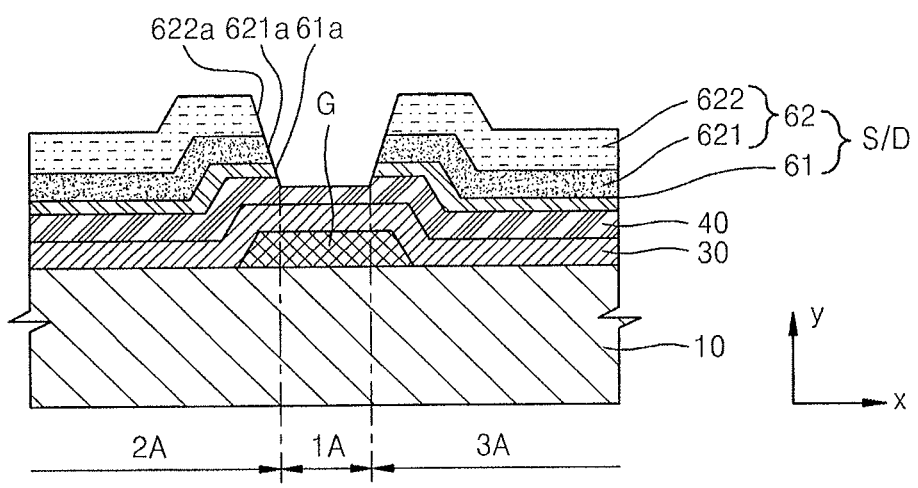

FIGS. 10 to 12 illustrate another embodiment of a method for manufacturing a TFT. As illustrated in FIG. 10, the method includes an operation of forming the metal layer 60 on the amorphous silicon layer 40'. This operation includes forming a first layer 60a (e.g., including Ti) on the amorphous silicon layer 40', and forming a second layer 60b on the first layer 60a. The first layer 60a and the second layer 60b may include different materials. For example, the first layer 60a may include Ti and the second layer 60b may include Cu. The first layer 60a and the second layer 60b may have different thicknesses, e.g., the first layer 60a may be thicker than the second layer 60b.

Next, as illustrated in FIG. 11, a portion of the metal layer 60 is removed from at least a portion of the first area 1A. Then, a heat treatment process is performed. As a result, the amorphous silicon layer 40' may be transformed into the polysilicon layer 40 using the metal catalysts 50 as illustrated in FIG. 12.

In the case where the first layer 60a is thicker, or at least has a predetermined thickness, all portions of the first layer 60a may not be transformed into a metal silicide layer. Rather, only a portion of the first layer 60a facing the amorphous silicon layer 40' may be transformed into the metal silicide layer 61. In this case, a remaining portion of the first layer 60a is maintained as is and indicated as the first layer 621 in FIG. 12.

Also, for illustrative purposes, the second layer 60b is shown as the second layer 622 in FIG. 12. The first and second layers 621 and 622 may be regarded as the additional metal layer 62. The stack formed of the metal silicide layer 61 and the additional metal layer 62 may be regarded as the source/drain electrode S/D. The end surface 621a of the first layer 621 facing the center of the first area 1A, the end surface 622a of the second layer 622 facing the center of the first area 1A, and the end surface 61a of the metal silicide layer 61 facing the center of the first area 1A may correspond to one another. This is because a portion of the metal layer 60 has been transformed into the metal silicide layer 61 after the metal layer 60 has been patterned.

An interface between the metal silicide layer 61 and the first layer 621 of the additional metal layer 62 may not be as clear as illustrated in FIG. 12. For example, the interface between the metal silicide layer 61 and the additional metal layer 62 may not be as clear as in FIG. 12, and a concentration of the metal silicide may decrease from a portion near the substrate 10 to a portion away from the substrate 10 (e.g., in the +y direction).

In the present embodiment, because the first layer 621 of the additional metal layer 62 and the metal silicide layer 61 include the same or similar elements, the adhesion strength between the first layer 621 and the metal silicide layer 61 may be excellent and the contact resistance therebetween may be significantly reduced. Also, because the second layer 622 includes a material (e.g., Cu) that has excellent electrical properties such as conductivity, electrical properties (e.g., conductivity) of the source/drain electrode S/D may be improved.

In accordance with another embodiment, a method is provided for manufacturing a display apparatus including one or more TFTs using any of the aforementioned method embodiments. In this embodiment, a display unit is electrically connected to one or more TFTs.

In accordance with this or another embodiment, a TFT may be formed to have a structure as illustrated in FIG. 4. For example, the TFT may include the substrate 10, and the polysilicon layer 40 and the source/drain electrode S/D disposed on the substrate 10. The substrate 10 may include the first area 1A, the second area 2A located at a side (e.g., in the −x direction) of the first area 1A, and the third area 3A located at the other side (e.g., in the +x direction) of the first area 1A. The source/drain electrode S/D is disposed on the polysilicon layer 40 in the first and third areas 1A and 3A and may include the metal silicide layer 61 near the polysilicon layer 40.

Because the source/drain electrode S/D includes the metal silicide layer 61 and because the metal silicide layer 61 contacts the polysilicon layer 40, the contact resistance between the source/drain electrode S/D and the polysilicon layer 40 may be significantly reduced. Thus, the TFT may be manufactured without using an expensive doping apparatus.

The metal silicide layer 61 may include metal catalysts used in a crystallizing process for forming the polysilicon layer 40. The metal catalysts may include, for example, Ni, Pd, Ti, Ag, Au, Al, Sn, Sb, Cu, Co, Mo, Tr, Ru, Rh, Cd, and/or Pt. The metal silicide layer 61 may include a silicide of a material that may getter the metal catalysts. For example, the metal silicide layer 61 may include titanium silicide. During the manufacturing process, the metal catalysts, which are used to crystallize the polysilicon layer 40, may not remain in the polysilicon layer 40 and may be moved to the metal silicide layer 61. As a result, the electrical properties of the manufactured TFT may be improved.

As illustrated in FIG. 5, the TFT may further include the additional metal layer 62 that contacts an upper surface of the metal silicide layer 61. The stack formed of the metal silicide layer 61 and the additional metal layer 62 may be regarded as the source/drain electrode S/D. The end surface 62a of the additional metal layer 62 facing the center of the first area 1A may not correspond to the end surface 61a of the metal silicide layer 61 facing the center of the first area 1A.

The metal silicide layer 61 may include a silicide of a material included in the additional metal layer 62. For example, the metal silicide layer 61 may include titanium silicide and the additional metal layer 62 may include Ti. In this case, because the additional metal layer 62 and the metal silicide layer 61 include the same or similar elements, the adhesion strength between the additional metal layer 62 and the metal silicide layer 61 may be excellent and the contact resistance therebetween may be significantly reduced.

As illustrated in FIG. 6, which is a cross-sectional view of a TFT formed according to another embodiment, the additional metal layer 62 may include the first layer 621 on the metal silicide layer 61 and the second layer 622 on the first layer 621. The metal silicide layer 61 may include a silicide of a material included in the first layer 621 and the second layer 622 may include a material different from that of the first layer 621. For example, the metal silicide layer 61 may include titanium silicide, the first layer 621 may include Ti, and the second layer 622 may include Cu.

In this case, because the first layer 621 of the additional metal layer 62 and the metal silicide layer 61 include the same or similar elements, the adhesion strength between the first layer 621 and the metal silicide layer 61 may be excellent and the contact resistance therebetween may be significantly reduced. Also, because the second layer 622 includes a material (e.g., Cu) that has excellent electrical properties such as conductivity, electrical properties (e.g., conductivity) of the source/drain electrode S/D may be improved. The stack formed of the additional metal layer 62 that includes the first and second layers 621 and 622 and the metal silicide layer 61 may be regarded as the source/drain electrode S/D.

The first and second layers 621 and 622 of the additional metal layer 62 may be simultaneously patterned during the manufacturing process, so that the end surface 621a of the first layer 621 facing the center of the first area 1A may correspond to the end surface 622a of the second layer 622 facing the center of the first area 1A. However, the end surface 621a of the first layer 621 facing the center of the first area 1A and the end surface 622a of the second layer 622 facing the center of the first area 1A may not correspond to the end surface 61a of the metal silicide layer 61 facing the center of the first area 1A metal silicide layer 61. This is because the metal layer 60 (refer to FIG. 3), which is used to form the metal silicide layer 61, is patterned during a process other than a process of patterning the first layer 621 or the second layer 622.

FIG. 9 is a cross-sectional view illustrating a TFT according to another embodiment. Unlike the TFT in FIG. 5, in this embodiment, the end surface 61*a* of the metal silicide layer 61 facing the center of the first area 1A, which includes a titanium silicide, may correspond to the end surface 62*a* of the additional metal layer 62 facing the center of the first area 1A, which includes Ti. This is because the metal silicide layer 61 and the additional metal layer 62 are not additionally formed.

The metal silicide layer 61 is formed by forming a thick metal layer (e.g., the metal layer 60 in FIG. 7), patterning the thick metal layer (refer to FIG. 8), and then transforming a portion of the metal layer 60 facing the amorphous silicon layer 40' into the metal silicide layer 61. Also, a remaining portion of the metal layer 60 may be regarded as the additional metal layer 62. The stack formed of the metal silicide layer 61 and the additional metal layer 62 may be regarded as the source/drain electrode S/D.

In this case, the interface between the metal silicide layer 61 and the additional metal layer 62 may not be as clear as illustrated in FIG. 9. For example, in the source/drain electrode S/D, the concentration of the metal silicide may decrease from a portion near the substrate 10 to a portion away from the substrate 10 (in a +y direction).

In the TFT according to the present embodiment, the source/drain electrode S/D that includes the metal silicide layer 61 and the additional metal layer 62 may be formed without performing a process of additionally forming the additional metal layer 62. Thus, the TFT may be manufactured at low cost according to simpler processes. In addition, because the metal silicide layer 61 and the additional metal layer 62 include the same or similar elements (e.g., the metal silicide layer 61 includes the titanium silicide and the additional metal layer 62 includes Ti), the contact resistance between the metal silicide layer 61 and the additional metal layer 62 may be reduced and the adhesion strength therebetween may be excellent.

FIG. 12 is a cross-sectional view illustrating a TFT according to another embodiment. Unlike the TFT in FIG. 9, in this embodiment, the additional metal layer 62 includes the first and second layers 621 and 622. Also, the TFT in this embodiment is different from the TFT in FIG. 6 in that the end surface 621*a* of the first layer 621 facing the center of the first area 1A, the end surface 622*a* of the second layer 622 in the center of the first area 1A, and the end surface 61*a* of the metal silicide layer 61 facing the center of the first area 1A correspond to one another.

Unlike the TFT in FIG. 9, this embodiment of the TFT additionally includes the second layer 622. The second layer 622 may be formed by using a material having high conductivity (e.g., Cu), so that electrical properties of the TFT may be improved. Unlike the TFT in FIG. 6, the additional metal layer 62 is not formed after forming the metal silicide layer 61. Rather, the additional metal layer 62 is formed by forming a thick first layer (e.g., the first layer 60*a* of FIG. 10) and a second layer (e.g., the first layer 60*b* of FIG. 10), patterning the thick first layer and the second layer (e.g., refer to FIG. 11), and transforming a portion of the first layer 60*a* facing the amorphous silicon layer 40' into the metal silicide layer 61. A remaining portion of the first layer 60*a* may be regarded as the first layer 621, and the second layer 60*b* may be regarded as the second layer 622. Then, the stack including the first and second layers 621 and 622 may be regarded as the additional metal layer 62. Also, the stack including the metal silicide layer 61 and the additional metal layer 62 may be regarded as the source/drain electrode S/D.

In this case, the interface between the metal silicide layer 61 and the first layer 621 of the additional metal layer 62 may not be as clear as illustrated in FIG. 12. For example, in the source/drain electrode S/D, the concentration of the metal silicide may decrease from a portion near the substrate 10 to a portion away from the substrate 10 (in the +y direction).

Because the number of patterning processes may be reduced according to the present embodiment, the TFT may be manufactured at low cost using simpler processes. In addition, the first layer 621 of the additional metal layer 62 and the metal silicide layer 61 may include the same or similar elements, for example, the metal silicide layer 61 may include the titanium silicide and the first layer 621 of the additional metal layer 62 may include Ti, the adhesion strength between the first layer 621 and the metal silicide layer 61 may be excellent. Also, the contact resistance therebetween may be significantly reduced. Also, because the second layer 622 includes a material (e.g., Cu) that has excellent electrical properties such as conductivity, electrical properties (e.g., conductivity) of the TFT may be improved.

In another embodiment, a display apparatus may include one or more TFTs manufactured according to one or more of the aforementioned embodiments. An example is discussed with reference to FIG. 13.

Figure 13:
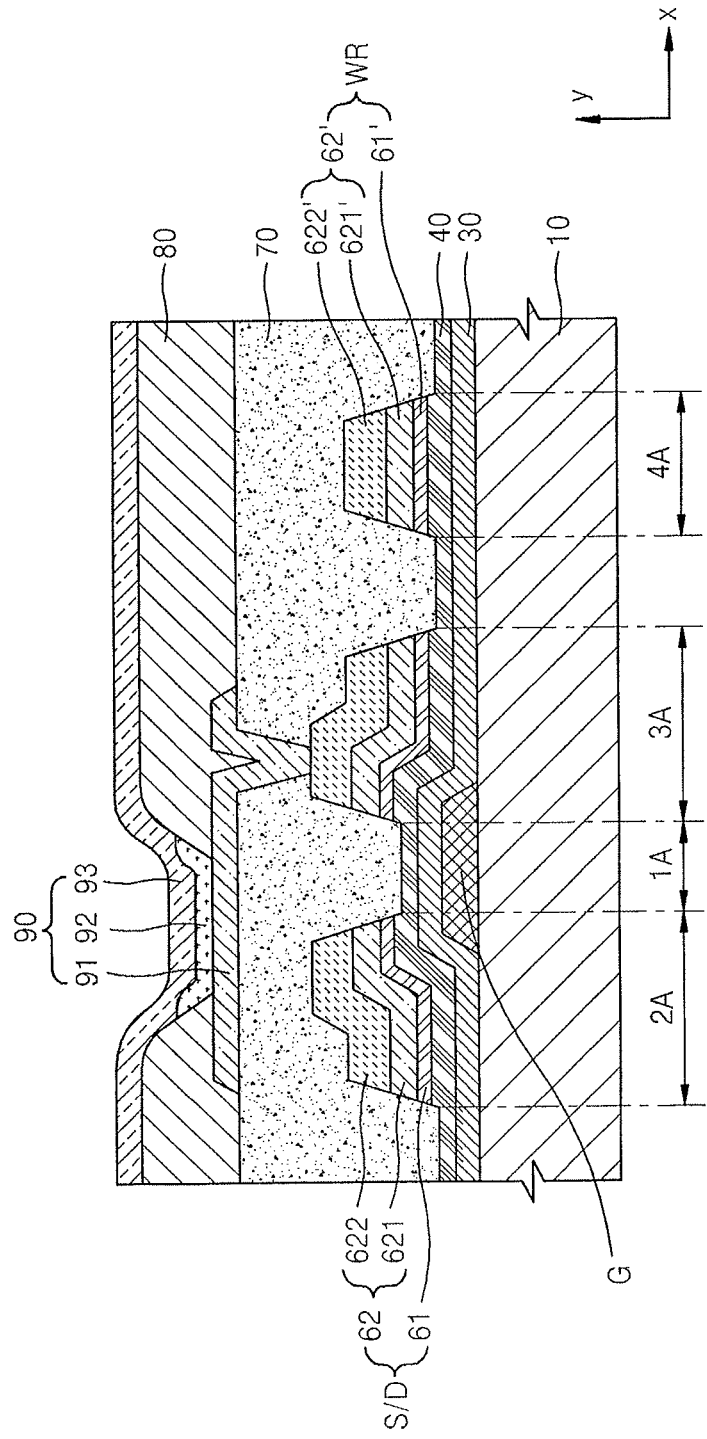
FIG. 13 illustrates an embodiment of a display apparatus.

FIG. 13 is a cross-sectional view illustrating an embodiment of a display apparatus. The display apparatus includes a TFT formed on the substrate 10, and a display unit that is electrically connected to the source/drain electrode S/D of the TFT. Also, FIG. 13 illustrates an organic light-emitting diode 90 that includes an intermediate layer 92 between a pixel electrode 91 and an opposing electrode 93 and that includes an emission layer. A protection layer or a planarization layer 70 may be under the display unit. Also, a pixel defining layer 80 may cover edges of the pixel electrode 91.

The display apparatus may be formed such that the source/drain electrode S/D of the TFT, which controls electric signals applied to the display unit, includes the metal silicide layer 61, so that the contact resistance between the source/drain electrode S/D and the polysilicon layer 40 is reduced and the electrical properties of the display apparatus are improved.

An electrode or other wirings of a capacitor may be simultaneously formed using, for example, the same material as the source/drain electrode S/D of the TFT. In this case, as illustrated in FIG. 13, a wiring WR may have the same or similar structure as the source/drain electrode S/D of the TFT.

In FIG. 13, the TFT may be similar in structure to that in FIG. 12. In this case, the wiring WR may include a metal silicide layer 61' and an additional metal layer 62' that includes a first layer 621' and a second layer 622'. Unlike FIG. 12, the source/drain electrode S/D may be patterned as in FIG. 13. If the display apparatus includes the TFT of FIG. 5, the TFT of FIG. 6, or the TFT of FIG. 9, the wiring WR may have the same or similar structure as the source/drain electrode S/D of the TFT, e.g., may have a structure in which the additional metal layer 62' is a single layer structure or a multi-layer structure in which end surfaces of the layers of the wiring WR may correspond or not correspond to one another.

As illustrated in FIG. 13, a thickness of the polysilicon layer 40 may change according to an area of the substrate 10.

For example, a thickness of the polysilicon layer 40 in the second and third areas 2A and 3A where the source/drain electrode S/D is located and a thickness of the polysilicon layer 40 in a fourth area 4A where the wiring WR is located may be greater than a thickness of the polysilicon layer 40 in areas other than the second, third, and fourth areas 2A, 3A, and 4A. This is because the wiring WR has the same or similar structure as the source/drain electrode S/D of the TFT. As a result, a portion of the upper surface of the amorphous silicon layer 40' in areas other than the first to fourth areas 1A to 4A may be removed during the manufacturing process (see, e.g., FIG. 3, 8, or 11).

By way of summation and review, a thin film transistor (TFT) includes a gate electrode, a source electrode, a drain electrode, and a semiconductor layer, e.g., a polysilicon layer. Some methods for making TFTs use expensive equipment which increase costs. Examples of this equipment include doping apparatuses for forming lightly doped drain (LDD) areas on the polysilicon layer. The LDD areas are formed, for example, to reduce contact resistance between source and drain regions and the polysilicon layer.

In accordance with one or more of the aforementioned embodiments, a TFT may be easily manufactured according to a simplified process. Also, a display apparatus including one or more of the TFTs, a method of manufacturing the TFT, and a method of manufacturing the display apparatus may also be provided.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A method of manufacturing a thin film transistor (TFT), the method comprising:
    forming an amorphous silicon layer on a substrate including a first area, a second area adjacent to one side of the first area, and a third area adjacent to another side of the first area;
    disposing metal catalysts on an upper surface of the amorphous silicon layer;
    forming a metal layer over the amorphous silicon layer and the metal catalysts in the second and third areas; and
    transforming the amorphous silicon layer into a polysilicon layer and conditioning the metal layer to include a metal silicide layer using a heat treatment process.

2. The method as claimed in claim 1, wherein forming the metal layer includes:
    forming the metal layer to cover the amorphous silicon layer and the metal catalysts in the first through third areas; and
    removing a portion of the metal layer in at least a portion of the first area.

3. The method as claimed in claim 2, wherein removing the portion of the metal layer includes removing at least a portion of the metal catalysts between the metal layer and the amorphous silicon layer in the first area.

4. The method as claimed in claim 1, wherein conditioning the metal layer includes transforming all portions of the metal layer into the metal silicide layer.

5. The method as claimed in claim 4, further comprising:
    forming an additional metal layer to contact the metal silicide layer.

6. The method as claimed in claim 5, wherein forming the additional metal layer includes using a material identical to a material used in forming the metal layer.

7. The method as claimed in claim 5, wherein forming the additional metal layer includes forming:
    a first layer including a material identical to a material used in forming the metal layer, and
    a second layer on the first layer, the second layer including a different material from the first layer.

8. The method as claimed in claim 1, wherein conditioning the metal layer includes transforming a portion of the metal layer facing the amorphous silicon layer into the metal silicide layer, wherein a remaining portion of the metal layer remains as an additional metal layer.

9. The method as claimed in claim 1, wherein forming the metal layer includes forming:
    a first layer over the amorphous silicon layer and the metal catalysts in the second and third areas, and
    a second layer on the first layer, wherein the second layer includes a material different from a material used to form the first layer.

10. The method as claimed in claim 9, wherein conditioning the metal layer includes transforming a portion of the first layer facing the amorphous silicon layer into the metal silicide, wherein a remaining portion of the first layer and the second layer remains as an additional metal layer.

11. A method of manufacturing a display apparatus, the method comprising:
    forming a thin film transistor (TFT) using the method as claimed in claim 1; and forming a display that is electrically connected to the TFT.

* * * * *